United States Patent [19]
Fischer et al.

[11] 3,887,935
[45] June 3, 1975

[54] INTEGRATED SEMICONDUCTOR ARRANGEMENT INCLUDING SOLAR CELL AND A SCHOTTKY DIODE

[75] Inventors: Horst Fischer, Heilbronn; Willi Pschunder, Flein, both of Germany

[73] Assignee: Licentia Patent-Verwaltungs-G.m.b.H., Frankfurt am Main, Germany

[22] Filed: Nov. 2, 1973

[21] Appl. No.: 412,105

[30] Foreign Application Priority Data

Nov. 3, 1972 Germany ........................... 2253831

[52] U.S. Cl. ...................... 357/15; 357/19; 357/29; 136/89

[51] Int. Cl. ........................ H01l 11/00; H01l 15/00

[58] Field of Search .......... 317/235, 27, 31; 136/89; 250/212

[56] References Cited

UNITED STATES PATENTS

| | | | |
|---|---|---|---|
| 2,981,777 | 4/1961 | Reynolds | 136/89 |
| 3,146,138 | 8/1964 | Shirland | 317/235 U |
| 3,437,818 | 4/1969 | Shattuck | 250/212 |
| 3,596,151 | 7/1971 | Eldridge | 317/235 N |
| 3,615,855 | 10/1971 | Smith | 317/235 N |
| 3,620,847 | 11/1971 | Wise | 317/235 N |
| 3,690,953 | 9/1972 | Wise | 317/235 N |
| 3,700,980 | 10/1972 | Belasco et al. | 317/235 U |
| 3,772,770 | 11/1972 | Arndt et al. | 317/235 N |

*Primary Examiner*—Andrew J. James
*Attorney, Agent, or Firm*—Spencer & Kaye

[57] ABSTRACT

An integrated semiconductor arrangement comprises a semiconductor body with a solar cell and a rectifying metal contact, the contact having a metal coating split up into largely separated regions which are, however, electrically connected together.

10 Claims, 4 Drawing Figures

INTEGRATED SEMICONDUCTOR ARRANGEMENT INCLUDING SOLAR CELL AND A SCHOTTKY DIODE

BACKGROUND OF THE INVENTION

This invention relates to an integrated semiconductor arrangement.

SUMMARY OF THE INVENTION

It is an object of the invention to improve solar cells for use in solar cell batteries.

According to a first aspect of the invention there is provided an integrated semiconductor arrangement, characterized in that a semiconductor body has, in addition to a solar cell, a rectifying metal semiconductor contact, and in that its metal coating is split up into regions, which are in connection with each other, but are to a large extent separated form each other.

According to a second aspect of the invention, there is provided an intergrated semiconductor arrangement comprising a semiconductor body, a solar cell in said semiconductor body and a rectifying metal semiconductor contact having a metal coating split up into regions largely separated from each other but electrically connected together.

BRIEF DESCRIPTION OF THE DRAWINGS

The invention will now be described in greater detail, by way of example, with reference to the drawings, in which.

DESCRIPTION OF THE PREFERRED EMBODIMENTS

Basically an integrated semiconductor arrangement is proposed, the semiconductor body of which has, in addition to a solar cell, a rectifying metal/semiconductor contact, the metal coating of which is split up into regions, which are in communication with each other, but substantially separated from each other.

Thus the metal coating of the metal-semiconductor contact does not have a coherent surface.

The metal coating of the metal-semiconductor contact of the integrated semiconductor arrangement in accordance with the invention may have, for example, in accordance with one form of embodiment of the invention, a finger or comb-like structure. In accordance with another form of embodiment of the invention the metal coating may have a ray form or a T-shaped structure. If the individual regions of the metal coating of the metal semiconductor contact are too narrow for contacting, then the metal coating may be provided with a correspondingly large contact surface, which facilitates the contacting of the metal coating.

This is necessary, for example, if the metal coating of the metal semiconductor contact comprises e.g., one or more thin fingers, which are not suitable for contacting. When using a comb structure for the metal coating, for example, the common connecting piece, which can also be called a comb spine, may be suitable as a connection surface, if it is constructed correspondingly wide. When using a T-shaped metal coating the transverse limb of the T may be suitable, for example, as the connection surface.

If the integrated semiconductor arrangements in accordance with the invention are connected together to form a solar cell battery, in each case, the metal semiconductor contact of one integrated semiconductor arrangement is connected to the ohmic rear side contact of the subsequent integrated semiconductor arrangement and the resistive rear side contact of one integrated semiconductor arrangement is connected to the resistive front side contact of the subsequent integrated semiconductor arrangement. In the case of such a solar cell battery, the ohmic front side contact of one of the two integrated semiconductor arrangements, lying outside, may serve as the negative pole and the ohmic rear side contact of the other of the two integrated semiconductor arrangements on the outside may serve as the positive pole of the solar cell battery.

Figure 1:
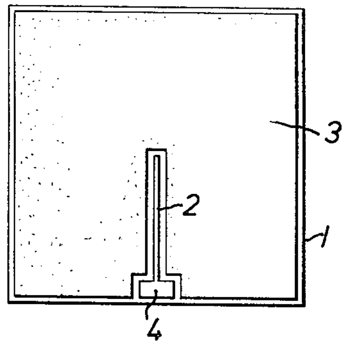
FIG. 1 shows the rear side of one form of integrated semiconductor arrangement in accordance with the invention.

Referring to the drawings, FIG. 1 shows an integrated semiconductor arrangement in accordance with the invention, that is to say its rear side. The integrated semiconductor arrangement shown comprises a semiconductor body 1, a metal semiconductor contact with the metal coating 2, a rear side contact 3, which substantially covers the rear side of the semiconductor body 1 for the ohmic contacting of the semiconductor body as well as a front side contact which is located on the opposite side and is therefore not visible in FIG. 1. This front side contact serves for the ohmic contacting of one of the semiconductor regions (likewise not shown) incorporated in the semiconductor body, which region has the opposite type of conductivity to the semiconductor body and in so doing forms a pn-junction with the semiconductor body. This pn-junction is the pn-junction of the solar cell.

In accordance with the invention the metal coating 2 of the metal semiconductor contact has a finger structure, so that the metal coating is extended and narrow and thus is constructed in a strip-like manner, and is substantially surrounded by the rear side contact 3. The metal coating 2 has at one of its ends further a broad limb 4 for use as a connection surface, so that the metal coating has an overall T-shape.

Figure 2:
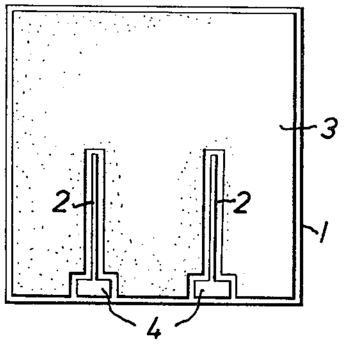
FIG. 2 is a view similar to FIG. 1 of a second form of arrangement.
Figure 3:
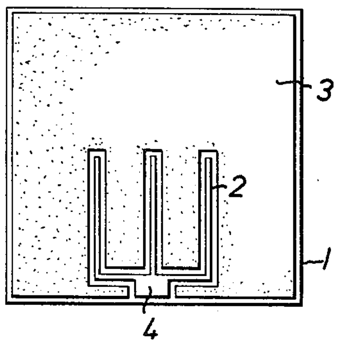
FIG. 3 is a view similar to FIG. 1 of a third form of arrangement.

The integrated semiconductor arrangement of FIG. 2 differs from the integrated semiconductor arrangement of FIG. 1 in that, instead of only one finger-shaped metal coating 2, two finger-shaped metal coatings 2 and thus two rectifying metal semi-conductor contacts, which are also called Schottky contacts, are present. Also in the case of the arrangement of of FIG. 2 the metal coatings 2 have an extended surface 4 to facilitate contacting and are thus also constructed in a T-shaped manner. In the case of the integrated semiconductor arrangement of FIG. 3 the individual fingers of the metal coating are connected together, as opposed to the arrangement according to FIG. 2, so that a comb structure results for the metal coating 2. Since in the exemplary embodiment of FIG. 3 not only the finger but also the comb spine is constructed to be relatively narrow, a special connection surface 4 is present.

Figure 4:
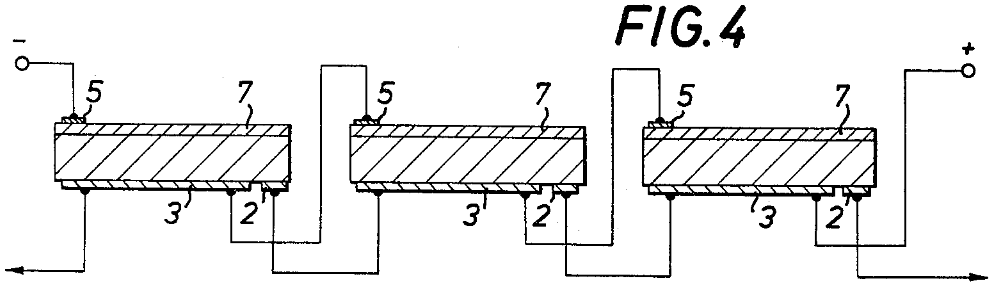
FIG. 4 shows diagrammatically the connection of a plurality of integrated semiconductor arrangements to form a solar cell battery.

As FIG. 4 shows, the combination necessary to form a solar cell battery consists in that in each case, the metal semiconductor contact 2 of one integrated semiconductor arrangement is connected to the ohmic rear side contact 3 of the subsequent integrated semiconductor arrangement and the ohmic rear side contact 3 of one integrated semiconductor arrangement is connected to the ohmic front side contact 5 of the subsequent integrated semiconductor arrangement. In the case of such a solar cell battery, the resistive front side contact 5 of one of the two integrated semiconductor arrangements lying on the outside, serves as the negative pole and the resistive rear side contact 3 of the other integrated semiconductor arrangements, lying on the outside, serves as the positive pole of the solar cell battery.

Moreover, in addition to the front side contact 5, the semiconductor region 6 of the opposite type of conductivity and the pn-junction 7 of the individual solar cells can also be seen in the drawing of FIG. 4.

It will be understood that the above description of the present invention is susceptible to various modifications, changes and adaptations.

What is claimed is:

1. An integrated semiconductor arrangement comprising in combination: a solar cell including a semiconductor body of a first conductivity type having a region of the opposite conductivity type adjacent one major surface thereof and forming the pn-junction of the solar cell, an ohmic front side contact for said region of opposite conductivity type and an ohmic rear side contact covering substantially the entire rear surface of said semiconductor body; and a metal coating on said rear surface of said semiconductor body and forming a rectifying metal semiconductor contact with said semiconductor body, said metal coating having at least one narrow strip-shaped portion which is substantially surrounded by but separated from said ohmic rear side contact of said solar cell.

2. An integrated semiconductor arrangement as defined in claim 1, wherein the metal coating of the metal semiconductor contact has a comb like structure.

3. An integrated semiconductor arrangement as defined in claim 1, wherein the metal coating of the metal semiconductor contact has a ray-shaped structure.

4. An integrated semiconductor arrangement as defined in claim 1, wherein the metal coating of the metal semiconductor contact has a T-shaped structure.

5. An integrated semiconductor arragement as defined in claim 1, wherein the metal coating of the metal semiconductor contact has a widened connection surface.

6. An integrated semiconductor arrangement as defined in claim 4, wherein the transverse limb of the T-shaped metal coating serves as the connection surface.

7. A solar cell battery comprising a plurality of integrated semiconductor arrangements as defined in claim 1, and whrein the metal semiconductor contact of one integrated semiconductor arrangement is connected to the ohmic rear side contact of the subsequent integrated semiconductor arrangement and the ohmic rear side contact of one integrated semiconductor arrangement is connected to the ohmic front side contact of the subsequent integrated semiconductor arrangement.

8. A solar cell battery as defined in claim 7, wherein the ohmic front side contact of one of the two integrated semiconductor arrangements, lying on the outside, is provided as the negative pole and the ohmic rear side contact of the two integrated semiconductor arrangements, lying on the outside, is provided as the positive pole of the solar cell battery.

9. In a solar cell including a semiconductor body of a first conductivity type having a region of the opposite conductivity type adjacent one major surface thereof to form the pn-junction of the solar cell, a first ohmic contact on said one major surface for contacting said opposite conductivity type region and a second ohmic contact on substantially the entire opposite major surface of said semiconductor body for contacting said semiconductor body; the improvement comprising at least one narrow strip-shaped metal coating on said opposite major surface and forming a rectifying metal semiconductor contact with said semiconductor body, said metal coating being substantially surrounded by, but spaced from, said second ohmic contact.

10. The semiconductor arrangement as defined in claim 9 wherein said metal coating includes a plurality of said strip-shaped portions which are spaced from each other but are electrically connected together.

* * * * *